United States Patent
Shiozaki et al.

(10) Patent No.: US 9,467,148 B2
(45) Date of Patent: Oct. 11, 2016

(54) OSCILLATION CIRCUIT, OSCILLATOR, ELECTRONIC DEVICE, MOVING OBJECT, AND CONTROL METHOD OF OSCILLATOR

(71) Applicant: Seiko Epson Corporation, Tokyo (JP)

(72) Inventors: Nobutaka Shiozaki, Shiojiri (JP); Yuichi Toriumi, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/842,000

(22) Filed: Sep. 1, 2015

(65) Prior Publication Data

US 2016/0072510 A1     Mar. 10, 2016

(30) Foreign Application Priority Data

Sep. 8, 2014    (JP) ................. 2014-182427

(51) Int. Cl.
     *H03L 1/00*      (2006.01)
     *H03B 5/32*      (2006.01)

(52) U.S. Cl.
     CPC .. *H03L 1/00* (2013.01); *H03B 5/32* (2013.01)

(58) Field of Classification Search
     CPC ........................................................ H03L 1/00
     USPC ..................................................... 331/64, 65
     See application file for complete search history.

(56) References Cited

U.S. PATENT DOCUMENTS

| | | | | |
|---|---|---|---|---|
| 5,278,792 A | * | 1/1994 | Inoue | G11C 7/22 365/148 |
| 6,715,090 B1 | * | 3/2004 | Totsuka | G06F 1/3203 709/209 |
| 7,977,916 B2 | * | 7/2011 | Hayakawa | H02J 7/0029 320/112 |

FOREIGN PATENT DOCUMENTS

| | | |
|---|---|---|
| JP | 09-294021 | 11/1997 |
| JP | 3911722 B2 | 5/2007 |

* cited by examiner

*Primary Examiner* — Joseph Chang
(74) *Attorney, Agent, or Firm* — Harness, Dickey & Pierce, P.L.C.

(57) ABSTRACT

In order to reduce the possibility of erroneous switching of an operation mode, an oscillation circuit, an oscillator, an electronic device and a moving object including: a power source detecting section that detects a power supply state; a determining section that determines an input state of a predetermined signal; and a control section that switches a operation mode when the determining section determines that input of the predetermined signal is detected within a predetermined time after it is detected that power is supplied, and a control method of the oscillator are provided.

17 Claims, 5 Drawing Sheets

OSCILLATION CIRCUIT, OSCILLATOR, ELECTRONIC DEVICE, MOVING OBJECT, AND CONTROL METHOD OF OSCILLATOR

BACKGROUND

1. Technical Field

The present invention relates to an oscillation circuit, an oscillator, an electronic device, a moving object, and a control method of an oscillator.

2. Related Art

An oscillator using a vibrator such as a quartz crystal resonator (piezoelectric vibrator) or a micro electro mechanical systems (MEMS) vibrator has been developed. Such an oscillator may have a special operation mode (for example, an operation mode for inspection, or an operation mode for setting information rewriting) used in manufacturing, in addition to an operation mode for normal use.

On the other hand, since a large number of terminals are not allowed for miniaturization of the oscillator, it may be difficult to provide an exclusive terminal for the special operation mode. For example, JP-A-9-294021 discloses a switch circuit in which analog/digital input and output terminals are commonly used in plural operation modes.

When an operation mode of an oscillator is switched by an electric potential or a signal input to a terminal, the operation mode may be erroneously switched due to affects of an unstable power source voltage, falling of thunderbolt, a physical shock, or the like.

SUMMARY

An advantage of some aspects of the invention is to provide an oscillation circuit, an oscillator, an electronic device, a moving object, and a control method of an oscillator capable of reducing the possibility of erroneous switching of an operation mode.

The invention can be implemented as the following forms or application examples.

Application Example 1

An oscillation circuit according to this application example includes a power source detecting section that detects a power supply state, a determining section that determines an input state of a predetermined signal, and a control section that selects a first operation mode when the determining section determines that input of the predetermined signal is detected within a predetermined time after the power source detecting section detects that power is supplied, and selects a second operation mode in other cases.

According to this application example, since the first operation mode can be selected within the predetermined time after power is supplied, it is possible to reduce the possibility of erroneous switching to the first operation mode due to affects of an unstable power source voltage, falling of thunderbolt, a physical shock, or the like. Accordingly, it is possible to realize an oscillation circuit capable of reducing the possibility of erroneous switching of an operation mode.

Application Example 2

In the oscillation circuit according to the application example described above, the control section may prevent switching from the second operation mode to the first operation mode.

According to this application example, it is possible to reduce the possibility of erroneous switching from the second operation mode to the first operation mode. Accordingly, it is possible to realize an oscillation circuit capable of reducing the possibility of erroneous switching of an operation mode.

Application Example 3

In the oscillation circuit according to the application example described above, the control section may perform, in the case of the first operation mode, switching to the second operation mode based on input of a predetermined command.

According to this application example, it is possible to perform switching to the second operation mode without through re-supply of power or the like.

Application Example 4

The oscillation circuit according to the application example described above may further include a storage section that stores setting information relating to an operation of the control section in the second operation mode. The control section may allow, in the case of the first operation mode, rewriting of the setting information.

According to this application example, since change of an operation in the second operation mode is allowed in the case of the first operation mode, it is possible to reduce the possibility of erroneous change of an operation in the second operation mode.

Application Example 5

An oscillator according to this application example includes the oscillation circuit described above, and a vibrator.

Application Example 6

An electronic device according to this application example includes the oscillation circuit described above.

Application Example 7

A moving object according to this application example includes the oscillation circuit described above.

According to the oscillator, the electronic device, and the moving object with such a configuration, since the oscillation circuit capable of reducing the possibility of erroneous switching of an operation mode is provided, it is possible to realize an oscillator, an electronic device, and a moving object capable of reducing the possibility of erroneous switching of an operation mode.

Application Example 8

A control method of an oscillator according to this application example includes selecting a first operation mode when it is determined that input of a predetermined signal is detected within a predetermined time after it is detected that power is supplied, and selecting a second operation mode in other cases.

According to this application example, since the first operation mode can be selected within the predetermined time after power is supplied, it is possible to reduce the possibility of erroneous switching to the first operation mode due to affects of an unstable power source voltage, falling of thunderbolt, a physical shock, or the like. Accordingly, it is possible to realize a control method of an oscillator capable of reducing the possibility of erroneous switching of an operation mode.

BRIEF DESCRIPTION OF THE DRAWINGS

The invention will be described with reference to the accompanying drawings, wherein like numbers reference like elements.

DESCRIPTION OF EMBODIMENTS

Hereinafter, preferred embodiments of the invention will be described in detail with reference to the accompanying drawings. The drawings are provided for ease of description. The embodiments described below do not improperly limit the contents of the invention disclosed in aspects. Further, all configurations described below are not essential elements of the invention.

1. Configuration Examples of Oscillator and Oscillation Circuit

Figure 1:
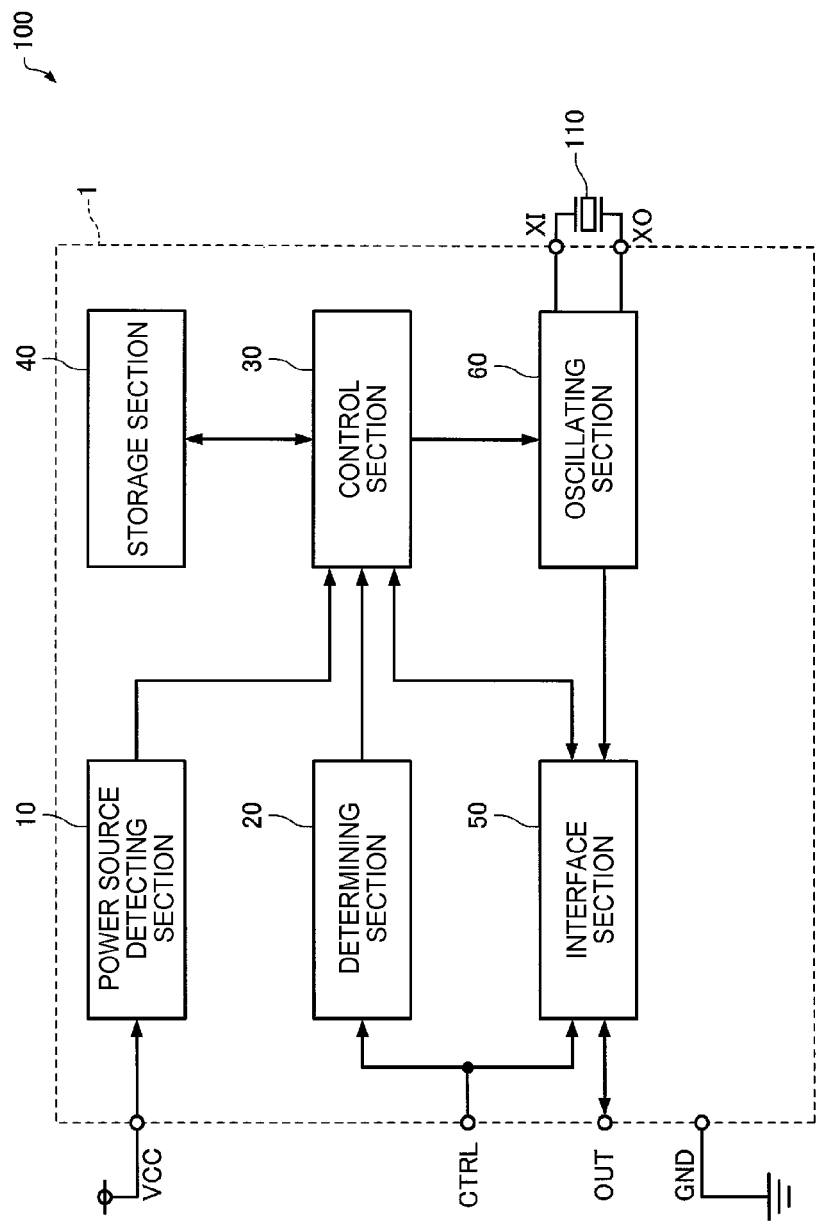
FIG. 1 is a circuit diagram illustrating an oscillator according to an embodiment.
Figure 2:
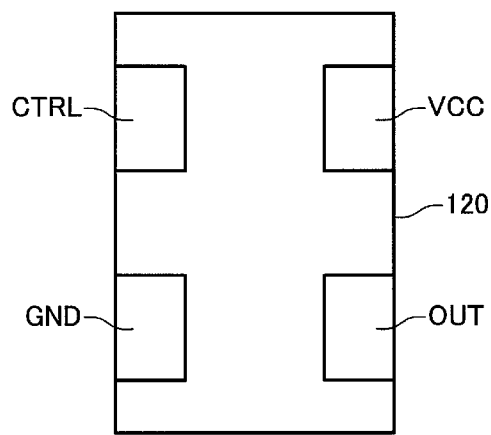
FIG. 2 is an appearance diagram (bottom view) illustrating terminal arrangement of an oscillator according to an embodiment.

FIG. 1 is a circuit diagram illustrating an oscillator 100 according to an embodiment. FIG. 2 is an appearance diagram (bottom view) illustrating terminal arrangement of the oscillator 100 according to the present embodiment.

As shown in FIGS. 1 and 2, the oscillator 100 according to the present embodiment is an oscillator including an oscillation circuit 1 and a vibrator 110, and the oscillation circuit 1 and the vibrator 110 are accommodated in a package 120.

In the present embodiment, the vibrator 110 is a quartz vibrator using quartz crystal as a substrate material, which may be an AT-cut quartz crystal vibrator or an SC-cut quartz vibrator, for example. The vibrator 110 may be a surface acoustic wave (SAW) resonator or a micro electro mechanical systems (MEMS) vibrator. Further, as the substrate material of the vibrator 110, a piezoelectric material such as piezoelectric single crystal such as lithium tantalate or lithium niobate or piezoelectric ceramics such as lead zirconate titanate (PZT), a silicon semiconductor material, or the like, in addition to quartz crystal, may be used. Excitation means of the vibrator 110 may employ a piezoelectric effect, or may employ electrostatic driving due to a Coulomb force.

The oscillation circuit 1 is provided with a VCC terminal which is a power source terminal, a GND terminal which is a grounding terminal, an OUT terminal which is an output terminal, a CTRL terminal for external interfacing, and an XI terminal and an XO terminal which are connection terminals with the vibrator 110. The VCC terminal, the GND terminal, the OUT terminal, and the CTRL terminal are also electrically connected to external terminals of the oscillator 100 shown in FIG. 2.

The oscillation circuit 1 includes a power source detecting section 10, a determining section 20, a control section 30, a storage section 40, an interface section 50, and an oscillating section 60. All or some of the configurations of the oscillation circuit 1 may be configured by a semiconductor circuit.

The power source detecting section 10 detects a power supply state. In an example shown in FIG. 1, the power source detecting section 10 detects whether or not a predetermined voltage is applied to the VCC terminal to detect the power supply state. The power source detecting section 10 may include a comparator that compares an electric potential of the VCC terminal and a reference potential, or may be various types of known power-on reset circuits. In the present embodiment, when the supply of power is detected, the power source detecting section 10 outputs a high level signal to the control section 30.

The determining section 20 determines an input state of a predetermined signal. In the example shown in FIG. 1, the determining section 20 determines whether or not a predetermined signal is input to the CTRL terminal. In the present embodiment, when the predetermined signal is input to the CTRL terminal, the determining section 20 outputs a high level signal to the control section 30.

The interface section 50 provides a communication interface between the oscillation circuit 1 and an external device. In the present embodiment, the interface section 50 may be a serial interface based on an I$^2$C standard, a serial peripheral interface (SPI) standard, or the like. In the example shown in FIG. 1, the interface section 50 provides a communication interface between the CTRL terminal and the control section 30 and a communication interface between the OUT terminal and the control section 30. Further, the interface section 50 outputs an output signal of the oscillating section 60 to the OUT terminal.

The oscillating section 60 is electrically connected to the vibrator 110 to perform an oscillation operation. As the oscillating section 60, for example, various types of known oscillation circuits such as a pierce oscillation circuit, an inverter type oscillation circuit, a Colpitts oscillation circuit, or a Hartley oscillation circuit, or a phase locked loop circuit (PLL circuit) including such an oscillation circuit may be used.

Figure 3:
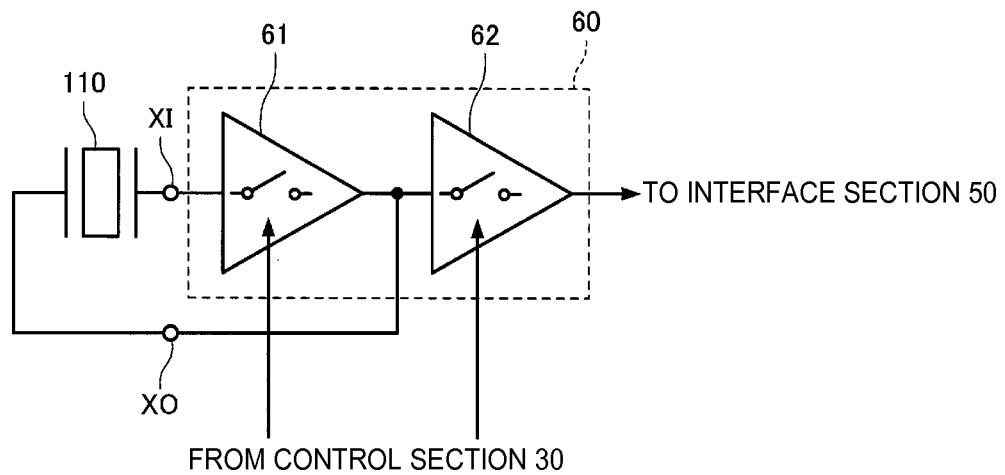
FIG. 3 is a circuit diagram illustrating an outline of a configuration of an oscillating section.

FIG. 3 is a circuit diagram illustrating an outline of a configuration of the oscillating section 60. In an example shown in FIG. 3, the oscillating section 60 includes an amplifying circuit 61, and a buffer circuit 62. The amplifying circuit 61 may be configured by an inverting amplifier circuit. The buffer circuit 62 may be configured by a buffer amplifier circuit. In the example shown in FIG. 3, an input terminal of the amplifying circuit 61 is electrically connected to a first electrode of the vibrator 110 through the XI terminal, and an output terminal thereof is electrically connected to a second electrode of the vibrator 110 through the XO terminal and is also electrically connected to an input terminal of the buffer circuit 62. Further, an output terminal of the buffer circuit 62 is electrically connected to the interface section 50.

The control section 30 controls the interface section 50, the oscillating section 60, and other circuit configurations (not shown) to control an operation of the oscillation circuit 1. The control section 30 selects a first operation mode as an operation mode when the determining section 20 determines that input of a predetermined signal is detected within a predetermined time after the power source detecting section 10 detects the supply of power, and selects a second operation mode as the operation mode in other cases. The control section 30 may include a timer for counting the predetermined time.

The first operation mode may be an interface mode in which a command for rewriting information stored in the storage section 40 is received, for example. The second operation mode may be a normal mode in which the amplifying circuit 61 and the buffer circuit 62 of the oscillating section 60 are operated to output an oscillation signal, for example. Further, when a high level voltage is applied to the CTRL terminal, the second operation mode may be a standby mode in which an operation of the amplifying circuit 61 of the oscillating section 60 is stopped, or an output enable mode in which the buffer circuit 62 of the oscillating section 60 is operated. The control section 30 outputs a control signal to the amplifying circuit 61 and the buffer circuit 62 of the oscillating section 60 to select an operation mode.

The storage section 40 stores setting information relating to an operation of the control section 30 in the second operation mode. The storage section 40 may include a non-volatile memory or a register. The setting information may be information indicating that the operation in the second mode corresponds to either one of the standby mode and the output enable mode, for example.

2. Operation Examples of Oscillator and Oscillation Circuit

Figure 4:
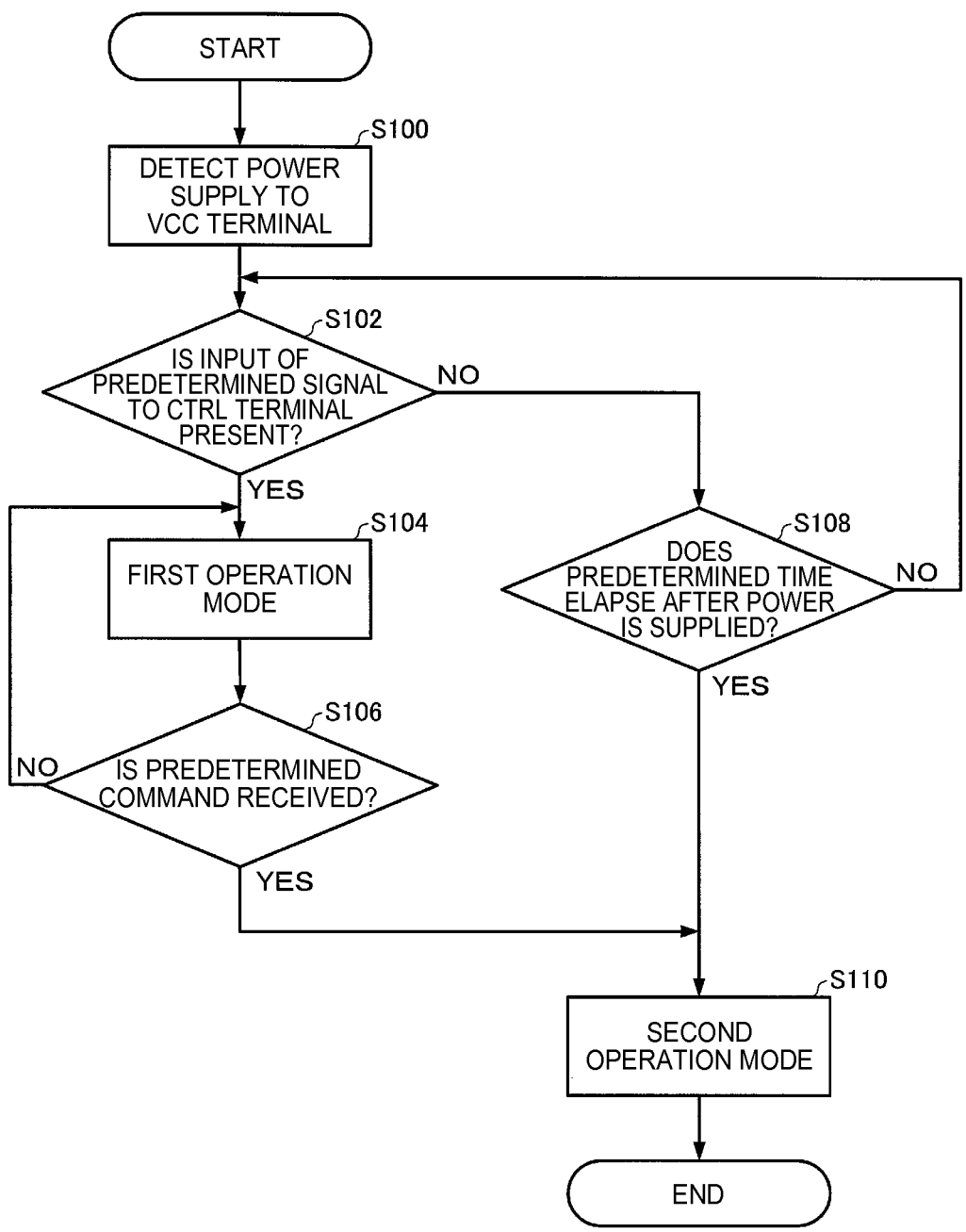
FIG. 4 is a flowchart illustrating an operation example of an oscillator according to an embodiment.
Figure 5:
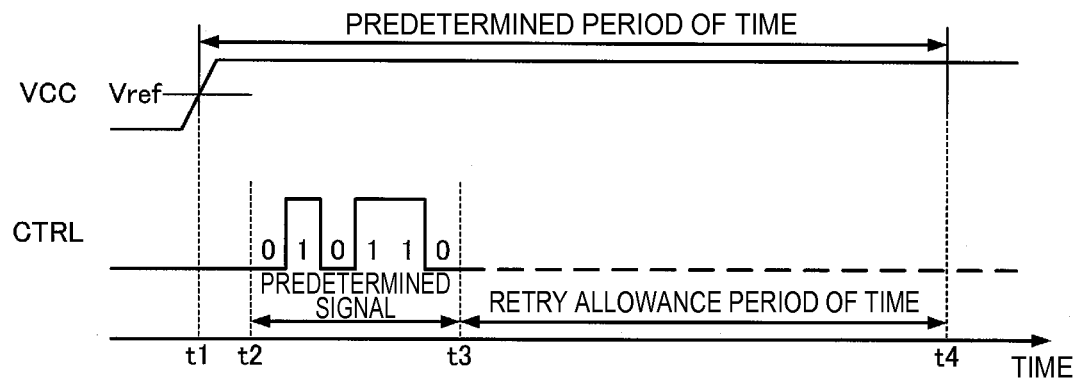
FIG. 5 is a timing chart for explaining an operation example of an oscillator according to an embodiment.

FIG. 4 is a flowchart illustrating an operation example of the oscillator 100 according to the present embodiment. FIG. 5 is a timing chart for explaining the operation example of the oscillator 100 according to the present embodiment. In FIG. 5, a transverse axis represents time, and a longitudinal axis represents voltage applied to a terminal. An upper diagram in FIG. 5 represents voltage applied to the VCC terminal, and a lower diagram represents voltage applied to the CTRL terminal.

A control method of the oscillator 100 according to the present embodiment includes a first process of selecting the first operation mode when it is determined that input of a predetermined signal is detected within a predetermined time after the supply of power is detected, and a second process of selecting the second operation mode in other cases. Step S100 to step S104 (which will be described later) correspond to the first process, and step S108 to step S110 correspond to the second process.

First, the oscillator 100 detects the supply of power to the VCC terminal (step S100). In the present embodiment, the power source detecting section 10 performs the process of step S100. In an example shown in FIG. 5, the power source detecting section 10 detects that the voltage applied to the VCC terminal exceeds a reference voltage Vref at a time point t1. Further, a predetermined period of time is started from the time point t1.

Subsequent to step S100, the oscillator 100 determines whether or not a predetermined signal is input to the CTRL terminal (step S102). In the present embodiment, the determining section 20 performs the process of step S102. In the example shown in FIG. 5, the determining section 20 determines that "010110" is detected as the predetermined signal between a time point t2 and a time point t3.

When it is determined that the predetermined signal is input to the CTRL terminal (YES in step S102), the oscillator 100 selects the first operation mode as an operation mode (step S104). In the present embodiment, the control section 30 performs the process of step S104.

When it is determined that the predetermined signal is not input to the CTRL terminal (NO in step S102), the oscillator 100 determines whether or not a predetermined time elapses after power is supplied (step S108). In the present embodiment, the control section 30 performs the process of step S108. In the example shown in FIG. 5, a period of time from the time point t1 to a time point t4 corresponds to the predetermined time.

When it is determined that the predetermined time does not elapse after power is supplied (NO in step S108), the procedure returns to step S102. When it is determined that the predetermined time elapses after power is supplied (YES in step S108), the oscillator 100 selects the second operation mode as the operation mode (step S110). In the present embodiment, the control section 30 performs the process of step S110. Subsequent to step S110, the selection of the operation mode is terminated.

In the present embodiment, since the first operation mode can be selected only within the predetermined time after power is supplied, it is possible to reduce the possibility of erroneous switching to the first operation mode due to affects of an unstable power source voltage, falling of thunderbolt, a physical shock, or the like. Accordingly, it is possible to realize an oscillation circuit 1, an oscillator 100, and a control method of the oscillator 100 capable of reducing the possibility of erroneous switching of an operation mode.

In the present embodiment, in the case of the second operation mode, the control section 30 may prevent switching to the first operation mode. In an example shown in FIG. 4, since the operation mode is terminated after the second operation mode is selected in step S110, switching to the first operation mode does not occur until power is supplied again and selection of the operation mode is started again.

According to the present embodiment, it is possible to reduce the possibility of erroneous switching from the second operation mode to the first operation mode. Accordingly, it is possible to realize an oscillation circuit 1, an oscillator 100, and a control method of the oscillator 100 capable of reducing the possibility of erroneous switching of an operation mode.

In the present embodiment, in the case of the first operation mode, the control section 30 may perform switching to the second operation mode based on input of a predetermined command. In the example shown in FIG. 4, after step S104, it is determined whether or not input of a predetermined command is received (step S106). When it is determined that the input of the predetermined command is not received (NO in step S106), the process of step S104 is performed to select the first operation mode. When it is determined that the input of the predetermined command is received (YES in step S106), the process of step S110 is performed to select the second operation mode.

According to the present embodiment, it is possible to perform switching to the second operation mode without through re-supply of power or the like.

In the present embodiment, in the case of the first operation mode, the control section 30 may allow rewriting of setting information stored in the storage section 40.

According to the present embodiment, in the case of the first operation mode, since the change of an operation in the second operation mode is allowed, it is possible to reduce the possibility of erroneous change of an operation in the second operation mode.

3. Electronic Device

Figure 6:
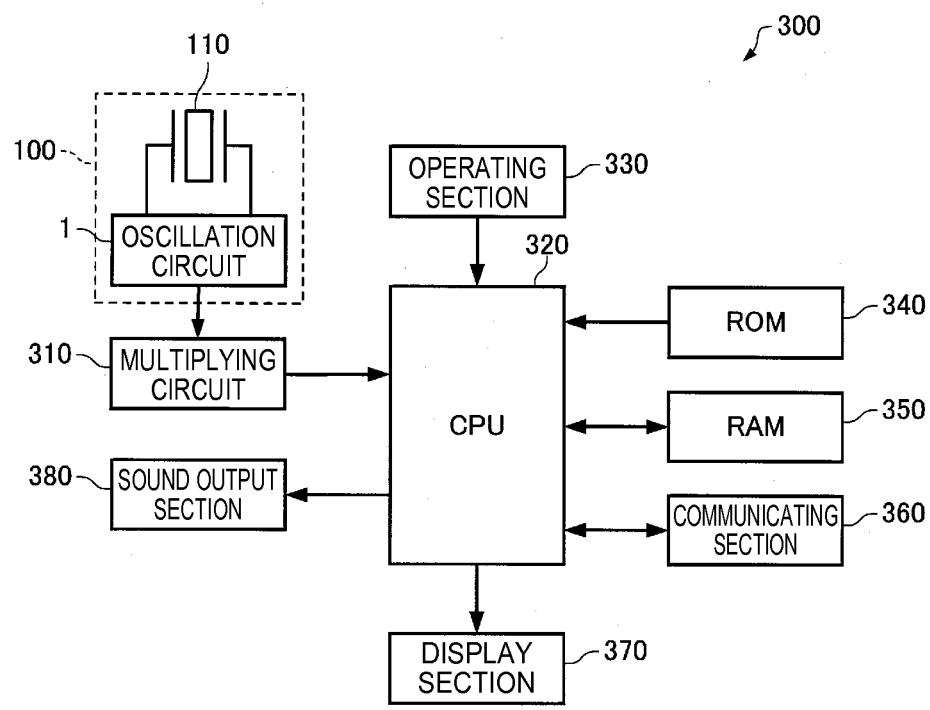
FIG. 6 is a functional block diagram illustrating an electronic device according to an embodiment.

FIG. 6 is a functional block diagram illustrating an electronic device 300 according to an embodiment of the invention. The same reference numerals are assigned to the same components as in the respective embodiments described above, and description thereof will not be repeated.

The electronic device 300 according to the present embodiment is an electronic device 300 including the oscillator 100. In an example shown in FIG. 6, the electronic device 300 includes the oscillator 100, a multiplying circuit 310, a central processing unit (CPU) 320, an operating section 330, a read only memory (ROM) 340, a random access memory (RAM) 350, a communicating section 360, a display section 370, and a sound output section 380. The electronic device 300 according to the present embodiment may have a configuration in which a part of the components (respective sections) shown in FIG. 6 are not provided or modified, or a configuration in which other components are added thereto.

The multiplying circuit 310 supplies a clock pulse to the respective sections as well as the CPU 320 (not shown). The clock pulse may be, for example, a signal obtained by extracting a desired harmonic wave signal from an oscillation signal from the oscillation circuit 1 connected to the vibrator 110 by the multiplying circuit 310, or a signal obtained by multiplying an oscillation signal from the oscillation circuit 1 by the multiplying circuit 310 including a PLL synthesizer (not shown).

The CPU 320 performs various calculation processes or control processes using the clock pulse output from the multiplying circuit 310 according to a program stored in the ROM 340 or the like. Specifically, the CPU 320 performs various processes based on an operation signal from the operating section 330, a process of controlling the communicating section 360 to perform data communication with an external device, a process of transmitting a display signal to display a variety of information in the display section 370, a process of outputting a variety of sound to the sound output section 380, or the like.

The operating section 330 is an input device configured by operation keys, button switches, or the like, and outputs an operation signal based on an operation from a user to the CPU 320.

The ROM 340 stores a program, data, or the like used when the CPU 320 performs various calculation processes or control processes.

The RAM 350 is used as a work area of the CPU 320, and temporarily stores a program or data read from the ROM 340, data input through the operating section 330, results of operations executed according to various programs by the CPU 320, or the like.

The communicating section 360 performs various controls for establishing data communication between the CPU 320 and an external device.

The display section 370 is a display device configured by a liquid crystal display (LCD) or an electrophoretic display, and displays a variety of information based on a display signal input from the CPU 320.

The sound output section 380 is a device that outputs sound, such as a speaker.

According to the electronic device 300 according to the present embodiment, since the oscillation circuit 1 capable of reducing the possibility of erroneous switching of an operation mode is provided, it is possible to realize an electronic device 300 capable of reducing the possibility of erroneous switching of an operation mode.

The electronic device 300 may include various types of electronic devices such as a personal computer (for example, a mobile type personal computer, a laptop type personal computer, a tablet type personal computer), a mobile terminal such as a cellular phone, a digital still camera, an inkjet type injection device (inkjet printer, for example), a storage area network device such as a router or a switch, a local area network device, a device for a mobile terminal base station, a television, a video camera, a video recorder, a car navigator, a pager, an electronic organizer (including a communication function), an electronic dictionary, an electronic calculator, an electronic game player, a game controller, a word processor, a work station, a TV phone, a TV monitor for crime prevention, electronic binoculars, a point of sale (POS) terminal, a medical device (for example, an electronic thermometer, a blood pressure manometer, a blood glucose monitoring system, an electrocardiographic apparatus, an ultrasonic diagnostic equipment or an electronic endoscope), a fish-finder, various measuring apparatuses, meters (for example, meters of a vehicle, an airplane or a ship), a flight simulator, a head-mounted display, a motion trace, motion tracking, a motion controller, PDR (pedestrian position direction measurement), or the like, for example.

Figure 7:
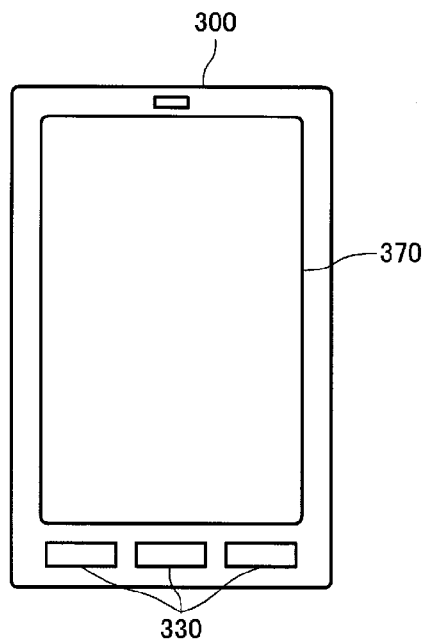
FIG. 7 is a diagram illustrating an appearance example of a smart phone which is an example of an electronic device.

FIG. 7 is a diagram illustrating an appearance example of a smart phone which is an example of the electronic device 300. The smart phone which is the electronic device 300 includes buttons as the operating section 330, and an LCD as the display section 370. Further, since the smart phone which is the electronic device 300 includes the oscillation circuit 1, it is possible to realize an electronic device 300 capable of reducing the possibility of erroneous switching of an operation mode.

4. Moving Object

Figure 8:
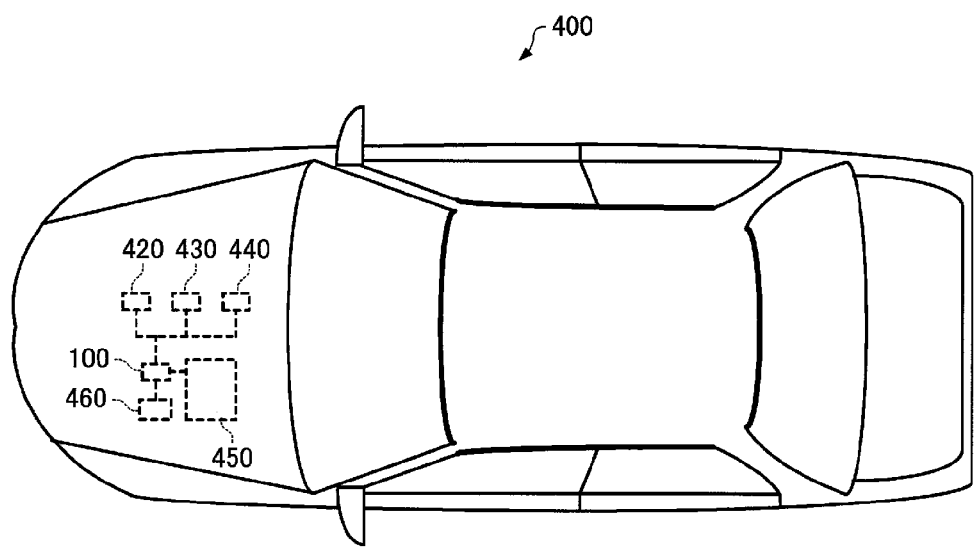
FIG. 8 is a diagram (top view) illustrating an example of a moving object according to an embodiment.

FIG. 8 is a diagram (top view) illustrating an example of a moving object 400 according to an embodiment of the invention. The same reference numerals are assigned to the same components as in the above-described respective embodiments, and detailed description thereof will not be repeated.

The moving object 400 according to the present embodiment is a moving object 400 including the oscillation circuit 1. In FIG. 8, a moving object 400 including the oscillator 100 that includes the oscillation circuit 1 is shown. Further, in an example shown in FIG. 8, the moving object 400 includes a controller 420, a controller 430 and a controller 440 that perform various controls for an engine system, a brake system, a keyless entry system and the like; a battery 450; and a backup battery 460. The moving object 400 according to the present embodiment may have a configuration in which apart of the components (respective sections) shown in FIG. 8 are not provided or modified, or a configuration in which other components are added thereto.

According to the moving object 400 according to the present embodiment, since the oscillation circuit 1 capable of reducing the possibility of erroneous switching of an operation mode is provided, it is possible to realize a moving object 400 capable of reducing the possibility of erroneous switching of an operation mode.

Such a moving object 400 may include various moving objects such as an automobile (electric automobile), an airplane such as a jet plane or a helicopter, a ship, a rocket, a satellite, or the like, for example.

Hereinabove, the present embodiments and the modified examples have been described, but the invention is not limited to the present embodiments and the modification examples, and may further include various modifications in a range without departing from the spirit of the invention.

The invention includes substantially the same configurations (for example, configurations having the same functions, methods and results, or configurations having the same objects and effects) as the configurations described in the embodiments. Further, the invention includes configurations in which a part that is not essential in the configurations described in the embodiments is substituted. Furthermore, the invention includes configurations having the same effects as in the configurations described in the embodiments, or configurations capable of achieving the same objects as in the configurations described in the embodiments. In addition, the invention includes configurations in which known techniques are added to the configurations described in the embodiments.

The entire disclosure of Japanese Patent Application No. 2014-182427, filed Sep. 8, 2014 is expressly incorporated by reference herein.

What is claimed is:

1. An oscillation circuit comprising:
a power source detector that is configured to detect whether a predetermined voltage is applied to the oscillation circuit;
a determining device that is configured to detect a predetermined signal that is input to the oscillation circuit; and
a controller that is configured to count a predetermined time period and that is configured to select one of a first operation mode and a second operation mode of the oscillation circuit, wherein
the predetermined time period corresponds to an elapsed time from a detection time at which the power source detector detects the predetermined voltage so that the predetermined time period expires at an expiration time,
the controller selects the first operation mode when the determining device detects the predetermined signal within the predetermined time period,
the controller selects the second operation mode at the expiration time of the predetermined period, and
the second operation mode corresponds to a normal operation in which the oscillation circuit outputs oscillation signals, and the first operation mode corresponds to an operation other than the normal operation.

2. The oscillation circuit according to claim 1,
wherein the controller prevents switching from the second operation mode to the first operation mode.

3. The oscillation circuit according to claim 1,
wherein the controller performs, during the first operation mode, switching to the second operation mode based on an input of a predetermined command.

4. The oscillation circuit according to claim 1, further comprising:
a storage that stores setting information relating to an operation of the controller in the second operation mode,
wherein the controller allows, during the first operation mode, rewriting of the setting information.

5. An oscillator comprising:
the oscillation circuit according to claim 1; and
a vibrator.

6. An oscillator comprising:
the oscillation circuit according to claim 2; and
a vibrator.

7. An oscillator comprising:
the oscillation circuit according to claim 3; and
a vibrator.

8. An oscillator comprising:
the oscillation circuit according to claim 4; and
a vibrator.

9. An electronic device comprising the oscillation circuit according to claim 1.

10. An electronic device comprising the oscillation circuit according to claim 2.

11. An electronic device comprising the oscillation circuit according to claim 3.

12. An electronic device comprising the oscillation circuit according to claim 4.

13. A moving object comprising the oscillation circuit according to claim 1.

14. A moving object comprising the oscillation circuit according to claim 2.

15. A moving object comprising the oscillation circuit according to claim 3.

16. A moving object comprising the oscillation circuit according to claim 4.

17. A control method of an oscillation circuit comprising:
detecting whether a predetermined voltage is applied to the oscillation circuit;
detecting whether a predetermined signal is input to the oscillation circuit;
counting a predetermined time period corresponding to an elapsed time from a detection time at which the applied predetermined voltage is detected so that the predetermined time period expires at an expiration time; and
selecting one of a first operation mode and a second operation mode, wherein
the first operation mode is selected when the predetermined signal is detected within the predetermined time period,
the second operation mode is selected at the expiration time of the predetermined period, and
the second operation mode corresponds to a normal operation in which the oscillation circuit outputs oscillation signals, and the first operation mode corresponds to an operation other than the normal operation.

* * * * *